United States Patent
Liu et al.

(10) Patent No.: US 7,253,470 B1
(45) Date of Patent: Aug. 7, 2007

(54) FLOATING GATE WITH UNIQUE PROFILE BY MEANS OF UNDERCUTTING FOR SPLIT-GATE FLASH MEMORY DEVICE

(75) Inventors: Shih-Chang Liu, Kaohsiung County (TW); Chi-Hsin Lo, Hsinchu County (TW); Chia-Shiung Tsai, Hsinchu (TW); Chi-Wei Ho, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/463,625

(22) Filed: Aug. 10, 2006

(51) Int. Cl.
*H01L 29/788* (2006.01)

(52) U.S. Cl. .................. 257/316; 438/266; 257/E27.078

(58) Field of Classification Search ........ 438/257–267; 257/316–321, E27.078
See application file for complete search history.

(56) References Cited

U.S. PATENT DOCUMENTS

| | | | | |
|---|---|---|---|---|
| 6,025,228 A | * | 2/2000 | Ibok et al. | 438/261 |
| 6,184,085 B1 | * | 2/2001 | Jeong | 438/258 |
| 6,656,796 B2 | * | 12/2003 | Chan et al. | 438/266 |
| 2001/0016385 A1 | * | 8/2001 | Chiang et al. | 438/257 |

* cited by examiner

*Primary Examiner*—Richard A. Booth
(74) *Attorney, Agent, or Firm*—Thomas, Kayden, Horstemeyer & Risley

(57) ABSTRACT

A split-gate flash memory device has a floating gate with a lateral recess at its bottom sidewall by adding an undercutting step. The split-gate flash memory device has a floating gate with a lateral recess on a substrate, an integrated dielectric layer lining the substrate, the sidewall and the lateral recess of the floating gate; a control gate on the integrated dielectric layer and covering at least part of the floating gate; and a dielectric spacer in the lateral recess between the integrated dielectric layer and the control gate.

11 Claims, 5 Drawing Sheets

FLOATING GATE WITH UNIQUE PROFILE BY MEANS OF UNDERCUTTING FOR SPLIT-GATE FLASH MEMORY DEVICE

TECHNICAL FIELD

The present invention relates to split-gate flash memory devices, and particularly to a floating gate with a unique profile by means of undercutting for a split-gate flash memory device.

BACKGROUND

Flash memory device is a non-volatile memory device capable of maintaining information stored in its memory cell without a power supply. One advantage of the flash memory device is its capacity for block-by-block memory erasure, and another advantage is its low electric consumption. The flash memory device can be classified into a stacked-gate cell, a split-gate cell, and the like, according to their corresponding cell transistor gate structures. A split-gate cell which includes a control gate physically implemented laterally adjacent to a floating gate is characterized by excellent efficiency in its erasure and program functionality. This high efficiency effectively protects the split-gate cell from inadvertent over-erasure of stored data.

As known in split-gate flash technology, forward-tunneling voltage (FTV) and reverse-tunneling voltage (RTV) are highly correlated to the floating gate profile. Also, RTV is correlated to a tiny nitride spacer formed between the lower edges of the floating gate and the control gate. This nitride spacer, also called a reverse-tunneling nitride (RTN) spacer, is used to prevent write disturbance caused by reverse tunneling. Thus, how to control the profile of the floating gate and maintain the film thickness of the RTN spacer are important issues for improving program and erasure performance. In one case of fabricating a floating gate with a tapered profile, a sharp tip at the corner edge of the floating gate is obtained to achieve desired low FTV. However, this tapered profile usually accompanies a thin RTN spacer since it is difficult to control the process of etching a nitride spacer on the slanted sidewall, causing unwanted low RTV. Comparatively, in another case of fabricating a floating gate with a vertical profile, a thicker RTN spacer is obtained to achieve desired high RTV, but the later etching process always rounds the corner edge of the floating gate to get unwanted high FTV for lack of the sharp poly-tip.

Accordingly, when the conventional floating gate having the tapered profile or the vertical profile is employed with the known nitride spacer etching process, a trade-off between FTV and RTV will be inevitably entailed. It is therefore desirable to provide a novel profile of the floating gate for maintaining low FTV and high RTV simultaneously.

SUMMARY OF THE INVENTION

Embodiments of the present invention include a floating gate with a lateral recess at its bottom edge and a dielectric spacer in the lateral recess between the floating gate and a control gate for a split-gate flash memory device.

In one aspect, the present invention provides a split-gate flash memory device has a floating gate with a lateral recess on a substrate, an integrated dielectric layer lining the substrate, the sidewall and the lateral recess of the floating gate; a control gate on the integrated dielectric layer and covering at least part of the floating gate; and a dielectric spacer in the lateral recess between the integrated dielectric layer and the control gate.

In another aspect, the present invention provides a split-gate flash memory device has a floating gate with a tapered sidewall a lateral recess on a substrate, an integrated dielectric layer lining the substrate, the tapered sidewall and the lateral recess of the floating gate; a control gate on the integrated dielectric layer and covering at least part of the floating gate; and a dielectric spacer in the lateral recess between the integrated dielectric layer and the control gate.

In another aspect, the present invention provides a the present invention provides a split-gate flash memory device has a floating gate with a vertical sidewall a lateral recess on a substrate, an integrated dielectric layer lining the substrate, the vertical sidewall and the lateral recess of the floating gate; a control gate on the integrated dielectric layer and covering at least part of the floating gate; and a dielectric spacer in the lateral recess between the integrated dielectric layer and the control gate.

In another aspect, the present invention provides a method of forming a split-gate flash memory device, including the steps of: providing a substrate comprising a gate dielectric layer patterned on said substrate, a floating gate patterned on said gate dielectric layer, and a dielectric cap layer on the top surface of said floating gate; performing an undercutting process to remove a portion of the sidewall of said floating gate, forming a lateral recess adjacent to the bottom of said floating gate; forming an integrated dielectric layer on said substrate to line the sidewall and said lateral recess of said floating gate; and forming a dielectric spacer on said integrated dielectric layer in said lateral recess.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
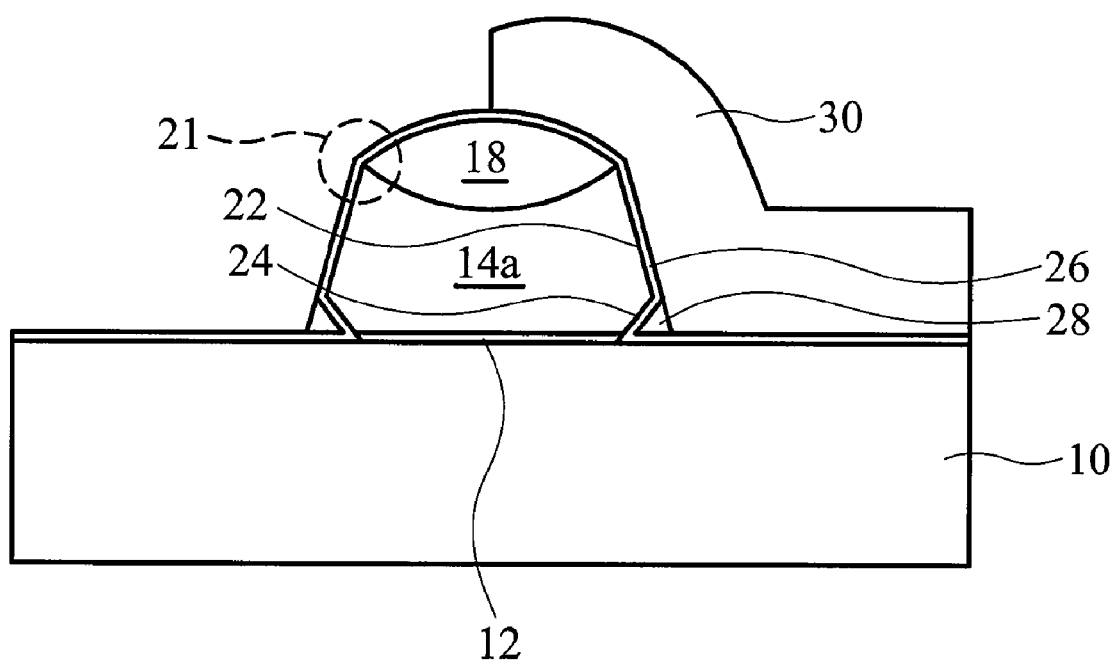
FIG. 1 is a cross-sectional diagram illustrating an exemplary embodiment of a floating gate with a unique profile for a split-gate cell.

Preferred embodiments of the present invention provide a floating gate with a lateral recess adjacent to its bottom edge and a dielectric spacer formed in the lateral recess between the floating gate and a control gate for a split-gate flash memory device. The inventive method of fabricating the same can be easily achieved by adding an undercutting step for forming the lateral recess, which is compatible with the existing floating gate process in spit-gate flash technology. The lateral recess by means of undercutting the floating gate profile can ensure a thick and sustainable spacer formed therein to prevent inadvertent reverse tunneling between the floating gate and the control gate, obtaining high RTV. It is also preferred that the sidewall portion of the floating gate, except for the lateral recess, has a slope which can achieve a sharp tip at the top corner edge of the floating gate to obtain low FTV. This unique profile of the floating gate, including a tapered profile combined with a lateral recess, therefore can obtain low FTV and high RTV simultaneously to improve program and erasure performance of a split-gate flash memory device. It is to be appreciated other sidewall shape (e.g., vertical sidewalls) combined with the lateral recess for the floating gate profile if desired.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, a cross-sectional diagram of FIG. 1 illustrates an exemplary embodiment of a floating gate with a unique profile for a split-gate cell. A substrate 10 is provided with an active device region of a split-gate cell. The split gate cell comprises a gate dielectric layer 12 patterned on the substrate 10, a floating gate 14a patterned on the gate dielectric layer 12, a dielectric cap layer 18 formed on the top surface of the floating gate 14a, a control gate 30 disposed over at least part of the floating gate 14a, an integrated dielectric layer 26 sandwiched between the floating gate 14a and the control gate 30, and a dielectric spacer 28 disposed adjacent to the bottom edge of the floating gate 14a between the integrated dielectric layer 26 and the control gate 30. The sidewall portion of the floating gate 14a comprises a tapered sidewall 22 at its upper portion and a lateral recess 24 at its lower portion. Preferably, the lateral recess 24 is formed at the bottom edge of the floating gate 14a by means of undercutting the floating gate 14a to expose the substrate 10. The integrated dielectric layer 26 is deposited to line the substrate 10, including the tapered sidewall 22 and the lateral recess 24, and the dielectric spacer 28 is disposed on the integrated dielectric layer 26 in the lateral recess 24. As used throughout this disclosure, the term "tapered profile" or the term "tapered sidewall" refers to the floating gate profile becomes gradually narrower or thinner toward its top end, that is, including a relatively wider bottom and a relative narrower top. Here, an angle of the tapered sidewall 22 is defined as an angle formed between the horizontal surface of the substrate 10 and the slanted portion of the floating gate 14a. The angle of the tapered sidewall 22 of the floating gate 14a is made at an angle less than 90 degrees (for example in a range from 60 to 85 degrees) by appropriately selecting the etching conditions. The tapered sidewall 22 can achieve a sharp tip 21 at the top corner edge of the floating gate 14a, and the dielectric spacer 28 formed in the lateral recess 24 can be thick and sustainable to prevent inadvertent reverse tunneling between the floating gate 14a and the control gate 30. Therefore, this unique profile of the floating gate 14a can obtain low FTV and high RTV simultaneously to improve programming and erasing performance of the split-gate cell.

In an exemplary embodiment of the present invention, cross-sectional diagrams of FIGS. 2A to 2F illustrate a method of forming a floating gate with a tapered sidewall and a lateral recess as shown in FIG. 1.

Figure 2A:
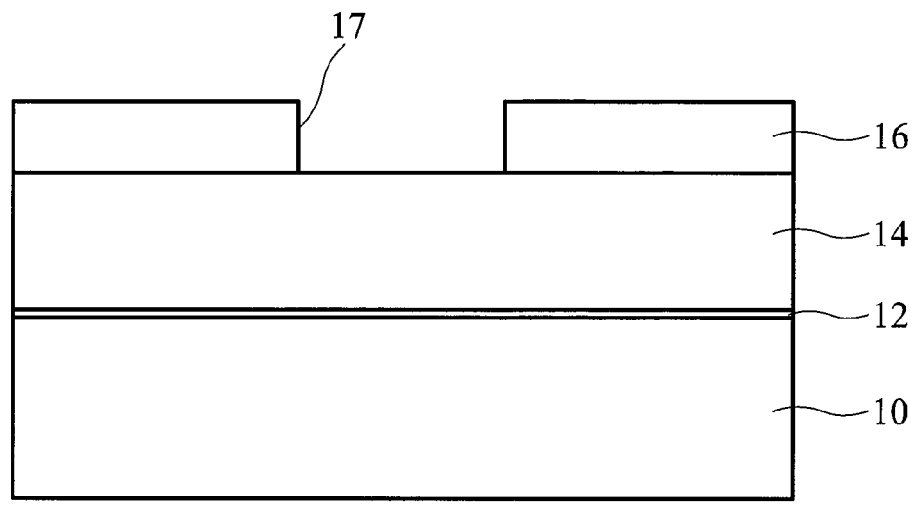
FIGS. 2A to 2F are cross-sectional diagrams illustrating a method of forming a floating gate with a tapered sidewall and a lateral recess.

In FIG. 2A, a substrate 10 is provided with an active device region for a split-gate cell, on which a gate dielectric layer 12, a first gate conductive layer 14 and a masking dielectric layer 16 are successively deposited. For exemplary purposes the substrate 10 may be a silicon substrate. The invention also has application to other semiconductor substrates, for example a substrate including an elementary semiconductor such as silicon, germanium, and diamond, or a compound semiconductor such as silicon carbide, gallium arsenic, indium arsenide, and indium phosphide. The substrate 10 may include an epitaxial layer overlying a bulk semiconductor, a silicon germanium layer overlying a bulk silicon, a silicon layer overlying a bulk silicon germanium, or a semiconductor-on-insulator (SOI) structure. The gate dielectric layer 12 may be a silicon oxide layer with a thickness between about 5 to about 150 Angstroms, for example, formed through a thermal oxidation process or a chemical vapor deposition (CVD) process. It is to be appreciated other well-known dielectric material such as oxides, nitrides, and combinations thereof for forming the gate dielectric layer 12. The thickness of the gate dielectric layer 12 is chosen specifically for the scaling requirements of the split-gate flash memory device technology. The first gate conductive layer 14 may be a polysilicon layer with a thickness between about 800 Angstroms to about 2000 Angstroms, which may be deposited through methods including, but are not limited to, Low Pressure CVD (LPCVD) methods, CVD methods and Physical Vapor Deposition (PVD) sputtering methods employing suitable silicon source materials. If desired the polysilicon layer may be ion implanted to the desired conductivity type. It is to be appreciated other well-known conductive materials such as metal, single crystalline silicon, or combinations thereof for forming the first gate conductive layer 14. The masking dielectric layer 16 has an opening 17 corresponding to an area where a floating gate is to be defined. The masking dielectric layer 16 may be a silicon nitride layer with a thickness between about 600 to about 1000 Angstroms. For patterning the opening 17, a photoresist layer is spun over the masking dielectric layer 16 using standard photolithography techniques, and then the exposed part of the masking dielectric layer 16 is etched way using dry etching techniques. The photoresist layer is then stripped off, leaving the masking dielectric layer 16 with the opening 17.

Figure 2B:
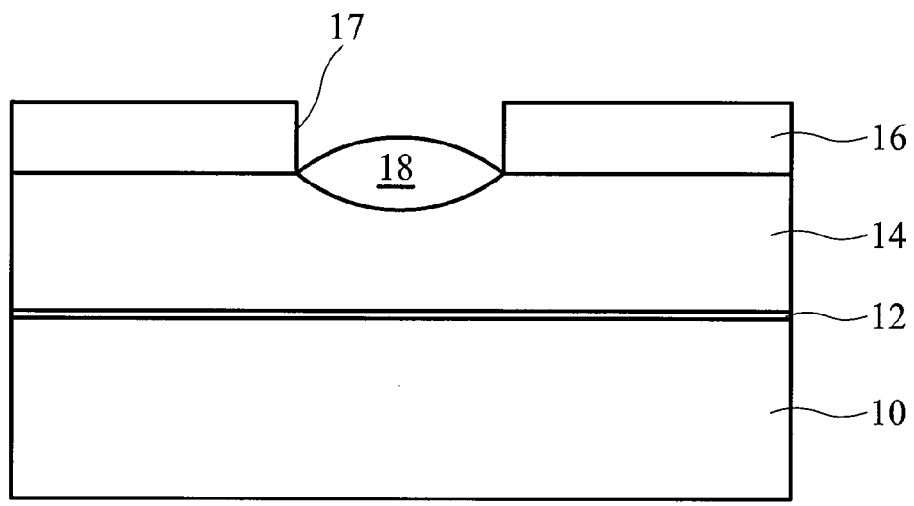

In FIG. 2B, the exposed area of the first gate conductive layer 14 in the opening 17 is oxidized to form a dielectric cap layer 18, for example an oxide cap layer grown on the first gate conductive layer 14 using the well known LOCOS process, leaving a depression on the top surface of the first gate conductive layer 14. In one embodiment, the dielectric cap layer 18 is a polyoxide layer grown on a polysilicon layer. The masking dielectric layer 16 is then etched away.

Figure 2C:
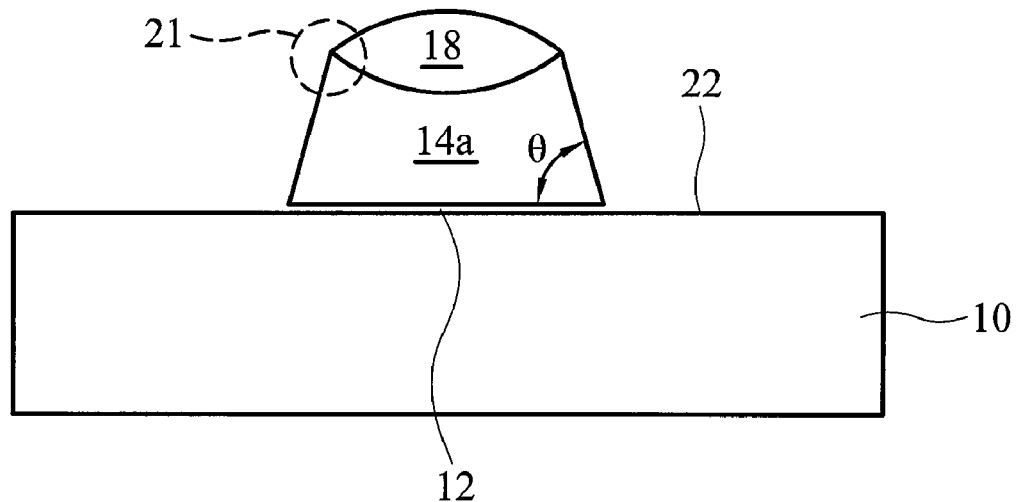

In FIG. 2C, using dry etching and the dielectric cap layer 18 as a mask, the first gate conductive layer 14 is etched, thus defining a floating gate 14a with tapered sidewalls 22. Portions of the gate dielectric layer 12 not protected by the floating gate 14a will be further etched away to expose the substrate 10. The etching process for the floating gate 14a uses a recipe comprising a low source power, gases of $Cl_2$ and HBr at a low $Cl_2$/HBr ratio. An angle ($\theta$) of the tapered sidewall 22 is defined as an angle between the horizontal surface of the substrate 10 and the slanted portion of the floating gate 14a. The angle ($\theta$) of the tapered sidewall 22 is made at an angle less than 90 degrees, for example in a range from 60 to 85 degrees, by appropriately selecting the etching conditions. The tapered sidewall 22 can achieve a sharp tip 21 at the top corner edge of the floating gate 14a to get low FTV.

Figure 2D:
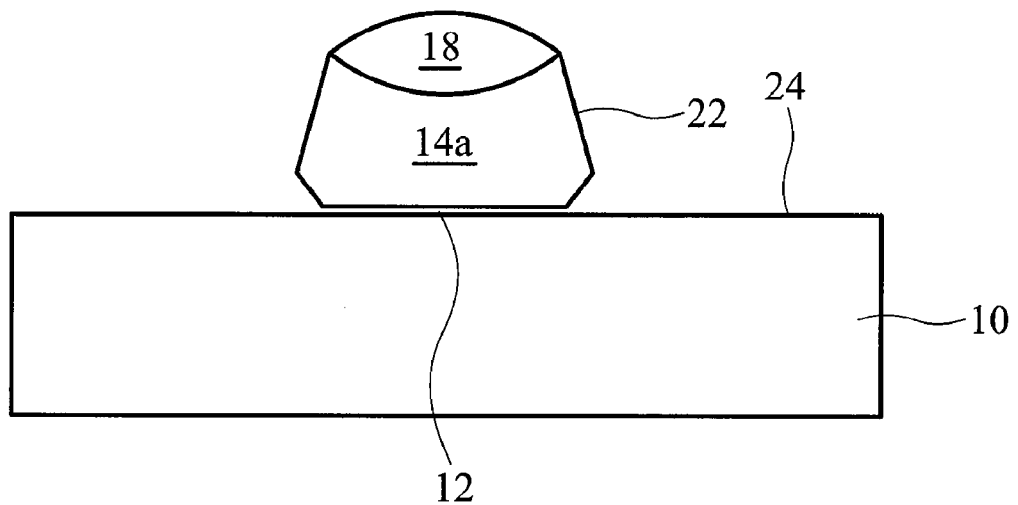

In FIG. 2D, an undercutting process is provided to undercut the bottom edge of the floating gate 14a, forming a lateral recess 24 at the lower portion of the tapered sidewall 22. Herein, portions of the gate dielectric layer 12 not protected by the floating gate 14a will be further etched away to expose the substrate 10. The etching process for the undercutting step uses a recipe comprising gases of $Cl_2$ at 10~100 sccm, for 5~20 seconds. The dimension and shape of the lateral recess 24 are not limited in the present invention. For example, the lateral recess 24 may have an arc side, one included angle formed by two sides, two or more than two included angles formed by several sides, which may be made by appropriately selecting the etching conditions. The lateral recess 24 can ensure a thick and strong spacer formed in subsequent processes to prevent inadvertent reverse tunneling between the floating gate 14a and the control gate 30.

Figure 2E:
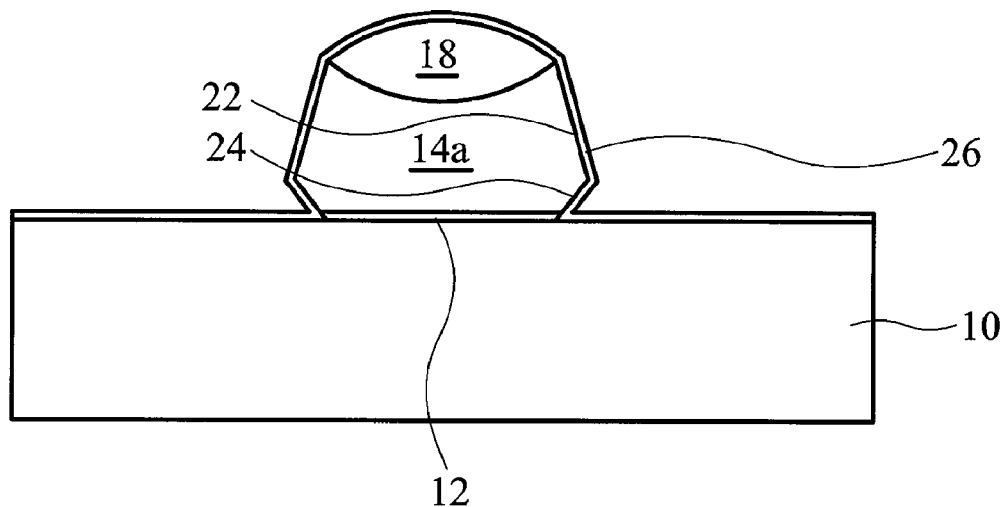

In FIG. 2E, an integrated dielectric layer 26 is conformally deposited to line the substrate 10, including the dielectric cap layer 18, the tapered sidewall 22 and the lateral recess 24. The integrated dielectric layer 26 is preferably a high-temperature oxide (HTO) layer by using thermal oxidation or low pressure vapor deposition at 900 to 1000° C. to an equivalent oxide thickness between about 50 Angstroms to 200 Angstroms. The HTO layer has good step coverage to line the unique profile of the floating gate 14a, including the tapered sidewall 22 and the lateral recess 24, while leave space for forming a dielectric spacer in the lateral recess 24 in subsequent processes. It is to be appreciated that the integrated dielectric layer 26 may be a pure oxide layer or an oxide/nitride/oxide structure if desired.

Figure 2F:
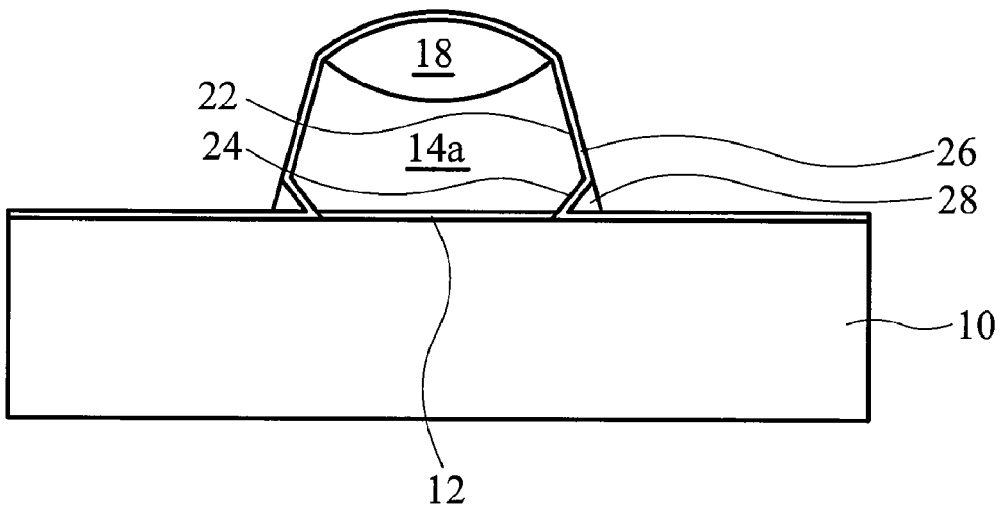

Subsequently, in FIG. 2F, a dielectric spacer 28 is formed in the lateral recess 28 through deposition and anisotropic etching processes. In detail, a silicon nitride layer is deposited on the integrated dielectric layer 26 to fill the lateral recess 24 using methods including CVD, LPCVD or advanced deposition process, and then a dry etching process is employed to remove the silicon nitride layer, leaving a nitride spacer 28 with good adhesion in the lateral recess 24. This nitride spacer 28 will be thick and sustainable to prevent inadvertent reverse tunneling between the floating gate 14a and the control gate 30. Although the nitride spacer 28 shown in FIG. 2F is a triangle spacer, the present invention provides value when fabricating any other geometric patterns of the nitride spacer 28 corresponding to the space provided by the lateral recess 24. It is also to be appreciated any other dielectric materials, different form the integrated dielectric material (e.g., silicon oxide), for forming the dielectric spacer 28.

After completing the floating gate 14a with the dielectric spacer 28 in the lateral recess 24, the control gate 30 as illustrated in FIG. 1 is formed by depositing a second gate conductive layer covering the integrated dielectric layer 26 and the dielectric spacer 28 and then patterning with another photoresist mask (not shown) and etching through the patterns in the photoresist mask. It is preferred to use a polysilicon layer with a thickness between about 1000 to 3000 Angstroms for fabricating the control gate 30. If desired the polysilicon layer can be ion implanted to the desired conductivity type. Thus, the integrated dielectric layer 26 is known as an interpoly dielectric layer, which separates the two polysilicon layers, namely, the floating gate 14a and the control gate 30. In addition, the control gate 30 may be a metal gate, a single crystalline silicon gate, or any combinations thereof if desired. Thereafter doped regions, serving as a source region and a drain region, will be formed in the substrate 10 adjacent to the floating gate 14a and the control gate 30 respectively, and separated apart from each other.

Figure 3:
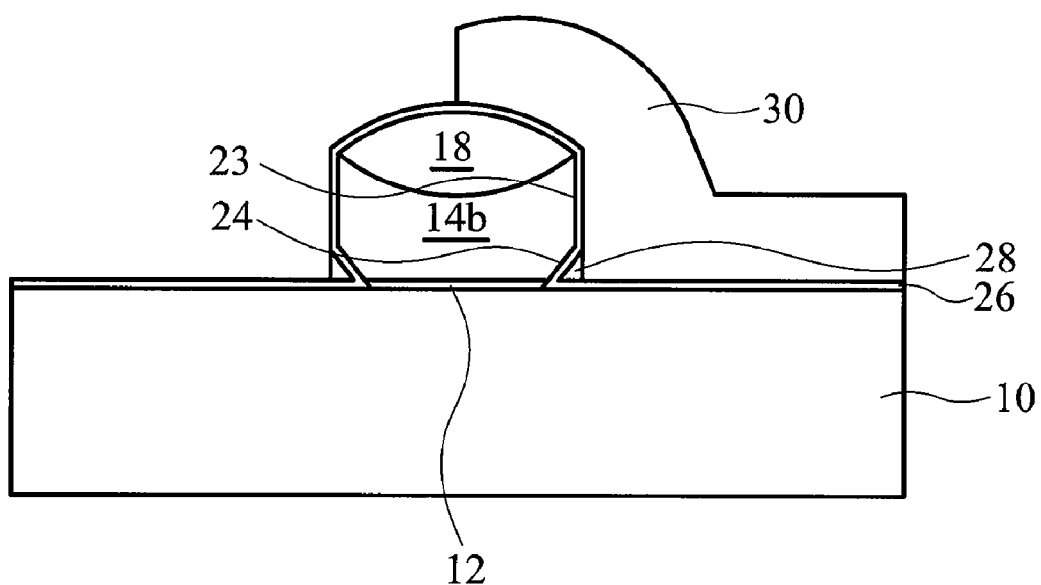
FIG. 3 is a cross-sectional diagram illustrating an exemplary embodiment of a floating gate with a vertical sidewall and a lateral recess for a split-gate cell.

Other sidewall shape combined with the lateral recess for forming the floating gate profile will be appreciated in the present invention. FIG. 3 is a cross-sectional diagram illustrating an exemplary embodiment of a floating gate with a vertical sidewall and a lateral recess for a split-gate cell. Explanation of the same or similar portions to the description in FIG. 1 is omitted herein. By comparison, the sidewall shape of the floating gate 14b comprises a vertical sidewall 23 at its upper portion and a lateral recess 24 at its lower portion. The etching process for the floating gate 14b uses a recipe comprising a high source power about 150 W~300 W, gases of $Cl_2$ at 10~30 sccm, HBr at 100~200 sccm, at a high $Cl_2$/HBr ratio about 1/5~1/20. This unique profile can provide a thick and sustainable spacer 28 in the lateral recess 24 to prevent inadvertent reverse tunneling between the floating gate 14b and the control gate 30.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A split-gate flash memory device, comprising:
    a floating gate formed overlying a substrate, wherein a sidewall of said floating gate comprises a lateral recess;
    an integrated dielectric layer formed overlying said substrate, said sidewall and said lateral recess of said floating gate;
    a control gate formed overlying said integrated dielectric layer and covering at least part of said floating gate; and
    a dielectric spacer formed in said lateral recess between said integrated dielectric layer and said control gate;
    wherein said sidewall of said floating gate comprises a tapered sidewall making said floating gate become gradually narrower toward the top of said floating gate.

2. The split-gate flash memory device of claim 1, wherein said lateral recess is adjacent to the bottom of said tapered sidewall.

3. The split-gate flash memory device of claim 1, wherein an angle between the horizontal surface of said substrate and said tapered sidewall of said floating gate is less than 90 degrees.

4. The split-gate flash memory device of claim 1, wherein said floating gate comprises a tip at the top corner edge of said floating gate.

5. The split-gate flash memory device of claim 1, wherein said dielectric spacer is a silicon nitride spacer, and said integrated dielectric layer is an oxide layer.

6. The split-gate flash memory device of claim 1, further comprising a dielectric cap layer on the top surface of said floating gate, and a gate dielectric layer between said floating gate and said substrate.

7. A split-gate flash memory device, comprising:
    a gate dielectric layer formed on a substrate;
    a floating gate formed on said gate dielectric layer, wherein said floating gate comprises a tapered sidewall and a lateral recess adjacent to the bottom of said tapered sidewall;
    a dielectric cap layer formed on the top surface of said floating gate;
    an integrated dielectric layer lining said substrate, said tapered sidewall and said lateral recess;
    a control gate formed on said integrated dielectric layer and covering at least part of said floating gate; and a dielectric spacer formed in said lateral recess between said integrated dielectric layer and said control gate;

wherein said tapered sidewall makes said floating gate become gradually narrower toward the top end of said floating gate.

8. The split-gate flash memory device of claim 7, wherein an angle between the horizontal surface of said substrate and said tapered sidewall of said floating gate is between 60 to 85 degrees.

9. The split-gate flash memory device of claim 7, wherein said floating gate comprises a tip at the top corner edge of said floating gate.

10. The split-gate flash memory device of claim 7, wherein said dielectric spacer is a nitride spacer filling said lateral recess.

11. The split-gate flash memory device of claim 7, wherein said integrated dielectric layer is an oxide layer.

* * * * *